United States Patent
Miyoshi et al.

(10) Patent No.: US 9,293,578 B2
(45) Date of Patent: Mar. 22, 2016

(54) SEMICONDUCTOR DEVICE

(71) Applicant: Hitachi, Ltd., Chiyoda-ku, Tokyo (JP)

(72) Inventors: Tomoyuki Miyoshi, Tokyo (JP); Takayuki Oshima, Tokyo (JP); Yohei Yanagida, Tokyo (JP); Hiroki Kimura, Tokyo (JP); Kenji Miyakoshi, Tokyo (JP)

(73) Assignee: Hitachi, Ltd., Tokyo (JP)

(*) Notice: Subject to any disclaimer, the term of this patent is extended or adjusted under 35 U.S.C. 154(b) by 0 days.

(21) Appl. No.: 13/935,264

(22) Filed: Jul. 3, 2013

(65) Prior Publication Data
US 2014/0015049 A1   Jan. 16, 2014

(30) Foreign Application Priority Data

Jul. 3, 2012 (JP) ................... 2012-149002

(51) Int. Cl.
*H01L 29/66* (2006.01)
*H01L 21/332* (2006.01)
*H01L 29/78* (2006.01)
(Continued)

(52) U.S. Cl.
CPC ........ *H01L 29/7818* (2013.01); *H01L 29/0692* (2013.01); *H01L 29/0696* (2013.01); *H01L 29/0847* (2013.01); *H01L 29/1095* (2013.01); *H01L 29/7816* (2013.01);
(Continued)

(58) Field of Classification Search
CPC ............. H01L 21/8238; H01L 27/0922; H01L 27/11807; H01L 2027/11807; H01L 21/76897; H01L 21/8224; H01L 21/8228; H01L 21/8234; H01L 21/823885; H01L 29/0847; H01L 29/42316; H01L 29/42384; H01L 29/66

USPC .......... 257/20, 194, 135–136, 213–413, 900, 257/902–903
See application file for complete search history.

(56) References Cited

U.S. PATENT DOCUMENTS

| 5,381,026 A * | 1/1995 | Shinohe et al. ............... 257/147 |
| 2009/0072308 A1* | 3/2009 | Chen .................. H01L 29/42368 257/336 |

(Continued)

FOREIGN PATENT DOCUMENTS

| JP | 2003-224133 A | 8/2003 |
| JP | 2011-003727 A | 1/2011 |

*Primary Examiner* — Selim Ahmed
*Assistant Examiner* — Moin Rahman
(74) *Attorney, Agent, or Firm* — Miles & Stockbridge P.C.

(57) ABSTRACT

Adverse effects can be hardly exerted on a current performance of an LDMOSFET to suppress the amount of carrier implantation from an anode layer of an LDMOS parasitic diode, and improve a reverse recovery withstand of the parasitic diode. The LDMOSFET includes a semiconductor substrate having a first semiconductor region formed of a feeding region of a first conductivity type at a position where a field oxide film is not present on a surface layer of a semiconductor region in which the field oxide film is selectively formed, and a second semiconductor region formed of a well region of a second conductivity type which is an opposite conductivity type, and feeding regions of the first conductivity type and the second conductivity type formed on an upper layer of the well region, and a gate electrode that faces the well region through a gate oxide film. The feeding region of the first semiconductor region is formed at a distance from the field oxide film near an end portion remote from the gate electrode, and desirably the feeding region is intermittently formed at intervals in the longitudinal direction.

9 Claims, 20 Drawing Sheets

(51) Int. Cl.
*H01L 29/06* (2006.01)
*H01L 29/08* (2006.01)
*H01L 29/423* (2006.01)
*H01L 29/10* (2006.01)
(52) U.S. Cl.
CPC ....... *H01L 29/7819* (2013.01); *H01L 29/7835* (2013.01); *H01L 29/1045* (2013.01); *H01L 29/42368* (2013.01)

(56) References Cited

U.S. PATENT DOCUMENTS

2011/0024838 A1* 2/2011 Kitazawa et al. ............. 257/337
2011/0278669 A1* 11/2011 Miyoshi et al. ............... 257/335

* cited by examiner

PLAN VIEW

SEMICONDUCTOR DEVICE

CROSS-REFERENCE TO RELATED APPLICATION

This application claims the priority of Japanese Patent Application No. 2012-149002 filed Jul. 3, 2012, which is incorporated herein by reference in its entirety.

BACKGROUND OF THE INVENTION

1. Field of the Invention

The present invention relates to a semiconductor device, and more particularly to a structure of a high withstand voltage MOSFET and a high withstand voltage diode each having a high reverse recovery withstand.

2. Background Art

As an element configuring a switching operation circuit having a high withstand voltage, there is a high withstand voltage LDMOSFET (Laterally Diffused MOS FET).

FIG. 1 illustrates a configuration diagram of an output driver circuit as an applied example of the LDMOSFET. In this circuit, the respective gate voltages of a switch element 1-1 (frequently configured by an n-type channel LMOSFET) and a switch element 1-2 (frequently configured by a p-type channel LDMOSFET) are controlled by a logic circuit 2 so that the switch element 1-1 and the switch element 1-2 alternately conduct switching operation.

FIG. 2 schematically illustrates a voltage change at an output point 3 in a normal operation. When the switch element 1-2 is on, and the switch element 1-1 is off, the voltage across the output point 3 rises to a positive potential applied to a power line 4-2, and when the switch element 1-1 is on, and the switch element 1-2 is off, the voltage across the output point 3 falls to a negative potential applied to a power line 4-1. Hence, the voltage across the output point 3 operates so that the potentials of the high voltage power lines 4-1 and 4-2 rise and fall at on/off timing of the switch elements 1-1 and 1-2.

From the viewpoint of the above-mentioned operational principle, this circuit is applied to a device having a large gain, and using a high voltage power supply such as an ultrasound pulse IC, and whether this circuit can be realized, or not, largely depends on the performance of the LDMOSFETs configuring this circuit.

FIG. 3 illustrates a cross-sectional structure of a related art p-type channel LDMOSFET. The features of the LDMOSFET reside in that, in order to withstand a high potential difference between drain and source regions, a drift layer 6 having a low concentration is disposed between the drain and the source regions, and at this portion, an electric field when a high voltage is applied to the p-type channel LDMOSFET is reduced to provide a high withstand voltage.

Also, the feature of this element resides in that a pn junction diode configured by the p-type drift layer 6 and an n-type semiconductor substrate 5 is parasitically present. Due to this diode, electric charge flows from a drain region 17 into a source region 16 when a source potential becomes higher than a drain potential. In an output driver circuit illustrated in FIG. 1, a capacitance and an inductance are connected to the output point 3 in a general use environment. When the switch element 1-2 transitions from off to on, due to the capacitance and the inductance, the drain potential of the switch element 1-2 may rise to the source potential or higher. In this situation, the above-mentioned parasitic diode operates, and a forward current flows into the switch element 1-2.

FIG. 4 schematically illustrates a voltage change at the output point 3 in this operation. In a period 101, a parasitic diode of the switch element 1-2 is in a forward state, and in a period 102, the parasitic diode of the switch element 1-2 is in a reverse state. Because the switch element 1-2 transitions from on to off immediately after the forward state, a reverse voltage is rapidly applied to the parasitic diode. In this situation, a current flows into the parasitic diode in a reverse direction for a while. This is because a minority carrier stored within the diode by a conductivity modulation of the carrier is pulled back with a high energy by rapid application of the reverse voltage. The reverse current is called "reverse recovery current" of the diode. When this current exceeds a given threshold value, the diode is broken down by heat generation caused by an eddy current. For that reason, a forward current that can flow into the parasitic diode is restricted, and a maximum forward current that does not break down the diode is generally called "reverse recovery withstand". For the purpose of improving the reverse recovery withstand of the pn junction diode, as the related art, as disclosed in JP-A-2011-003727, there is a technique in which a region having a Schottky contact interface is disposed on a surface on an anode side of the pn junction diode, and the implantation of the minority carrier is restricted at the time of the forward state to reduce the amount of reverse current and improve the withstand at the time of the reverse state. Also, as disclosed in JP-A-2003-224133, there is a technique in which, in the high withstand voltage diode in which the anode region and the cathode region are selectively formed on a semiconductor surface, an anode length and a cathode length are made different from each other so that the amount of current that flows around an anode end portion at the time of the reverse recovery is reduced, and breakdown caused by the concentration of the current is prevented to substantially improve the breakdown withstand.

SUMMARY OF THE INVENTION

The present inventors have examined problems concerning the reverse recovery withstand of the parasitic diode of the LDMOS through a device simulation.

FIG. 5 illustrates a profile distribution of a calculation target which simulates a plan layout site related to parasitic diode operation in the related art LDMOSFET. An anode region formed of a p-type feeding layer 20 and a cathode region formed of an n-type feeding layer 21 are partially formed inside of an n-type drift layer 18. In this example, the n-type drift layer 18 is formed by diffusing phosphorus of $2.0E^{15}$ cm$^{-2}$ into a p-type semiconductor substrate doped with boron of $6.0E^{13}$ cm$^{-2}$, a p-type drift layer 19 is formed by diffusing boron of $1.0E^{16}$ cm$^{-2}$ thereinto, and the p-type feeding layer 20 is formed by diffusing boron of $1.0E^{16}$ cm$^{-2}$ thereinto. Also, the n-type feeding layer 21 is obtained by diffusing phosphorous of $1.0E^{19}$ cm$^{-2}$ into the p-type semiconductor substrate. An interval between the p-type feeding layer 20 and the n-type feeding layer 21 is set to 12.0 μm.

An equipotential line, a hole distribution, and a temperature distribution calculated for the high withstand voltage diode illustrated in FIG. 5 at the time of the reverse recovery are illustrated in FIGS. 6, 7, and 8, respectively.

The reverse recovery state is evaluated by raising a voltage across a cathode electrode 46 to 100V at 100 ns from a state in which a forward current is allowed to flow into the diode by allowing −3 V to be applied to the cathode electrode 46 connected to the n-type feeding layer 21 in a state where voltages across an anode electrode 47 connected to the p-type feeding layer 20, and a peripheral electrode 48 are fixed to 0V.

As illustrated in FIG. 7, holes flow toward an end portion of the p-type feeding layer 20 in a long side direction thereof.

Also, as illustrated in FIG. 6, a potential gradient is steep in a region from the end portion of the p-type feeding layer 20 in the long side direction toward an element separation region 22, and an electric field intensity become higher. This is because the region between the p-type feeding layer 20 and the element separation region 22 is not completely depleted. With the above configuration, a current is concentrated on the end portion of the p-type feeding layer 20 in the long side direction to generate heat.

As illustrated in FIG. 8, a rise in temperature is concentrated on the end portion of the p-type feeding layer 20 in the long side direction, and it is conceivable that this site is liable to be broken down.

From the above results, the present inventors have found out that the suppression in the amount of holes implanted from the anode, and a reduction in the charge amount of holes on the anode region end portion are effective in improvement of the reverse recovery withstand of the parasitic diode.

Therefore, it is conceivable that the techniques disclosed in JP-A-2011-003727 and JP-A-2003-224133 for the diode are applied to the parasitic diode of the LDMOS might have the effect of the withstand improvement.

However, the related art induces the degradation of a current performance of the MOSFET as an adverse effect. Specifically, when the anode site is subjected to a Schottky junction, a resistance of the feeding portion is raised to increase an on-state resistance of the MOSFET, thereby leading to adverse effects such as the deterioration of the performance per unit size, and an increase in the element size. Also, when the anode length is different from the cathode length, a site disposed between the anode or cathode, and the element separation region, which does not contribute to the performance (that is, a dead space region) is increased, resulting in adverse effects such as the deterioration of the performance per unit size, and the increase in the element size.

An object of the present invention is to provide a semiconductor device and a method of manufacturing the semiconductor device, which substantially avoid the adverse effects on the current performance of the LDMOSFET, suppress the amount of carrier implantation from the anode layer of the LDMOS parasitic diode, and improve the reverse recovery withstand of the parasitic diode.

The LDMOSFET according to the present invention includes a semiconductor substrate having a first semiconductor region formed of a feeding region of a first conduction type at a position where a field oxide film is not present on a surface layer of a semiconductor region in which the field oxide film is selectively formed, and a second semiconductor region formed of a well region of a second conduction type, which is an opposite conduction type, feeding regions of the first conduction type and the second conduction type formed on an upper layer of the well region, and a gate electrode that faces the well region through a gate oxide film. The feeding region of the first semiconductor region is formed at a distance from the field oxide film near an end portion of the field oxide film remote from the gate electrode, and desirably the feeding region intermittently formed at given intervals in the longitudinal direction.

According to the present invention, the degradation of the current performance of the high withstand voltage LDMOSFET can be suppressed, and the reverse recovery withstand of the parasitic diode can be improved. Also, as compared with the related art, the element size can be reduced.

Further, when the present invention is applied to the high withstand voltage diode, the reverse recovery withstand can be improved likewise.

BRIEF DESCRIPTION OF THE DRAWINGS

FIGS. 10A and 10B are diagrams illustrating the structure of the p-type channel LDMOSFET according to the first embodiment of the present invention, in which FIG. 10A illustrates a cross-sectional view (A-A') of FIG. 9, and FIG. 10B illustrates a cross-sectional view (B-B') of FIG. 9;

FIGS. 15A and 15B are cross-sectional views of FIG. 14 illustrating the structure of the p-type channel LDMOSFET according to the second embodiment of the present invention, in which FIG. 15A illustrates a cross-sectional view (A-A'), and FIG. 15B illustrates a cross-sectional view (B-B');

FIGS. 19A and 19B are cross-sectional views of FIG. 18 illustrating the structure of the n-type channel LDMOSFET according to the third embodiment of the present invention, in which FIG. 19A illustrates a cross-sectional view (A-A'), and FIG. 19B illustrates a cross-sectional view (B-B');

FIGS. 21A and 21B are cross-sectional views of FIG. 20 illustrating the structure of the diode according to the fourth embodiment of the present invention, in which FIG. 21A illustrates a cross-sectional view (A-A'), and FIG. 21B illustrates a cross-sectional view (B-B');

FIGS. 23A and 23B are cross-sectional views of FIG. 22 illustrating the structure of the n-type channel LDMOSFET according to the fifth embodiment of the present invention, in which FIG. 23A illustrates a cross-sectional view (A-A'), and FIG. 23B illustrates a cross-sectional view (B-B').

DETAILED DESCRIPTION OF THE PREFERRED EMBODIMENTS

A conduction type described below is exemplary, and the same advantages can be expected even if an n-type and a p-type in the respective embodiments are reversed.

First Embodiment

Figure 1:
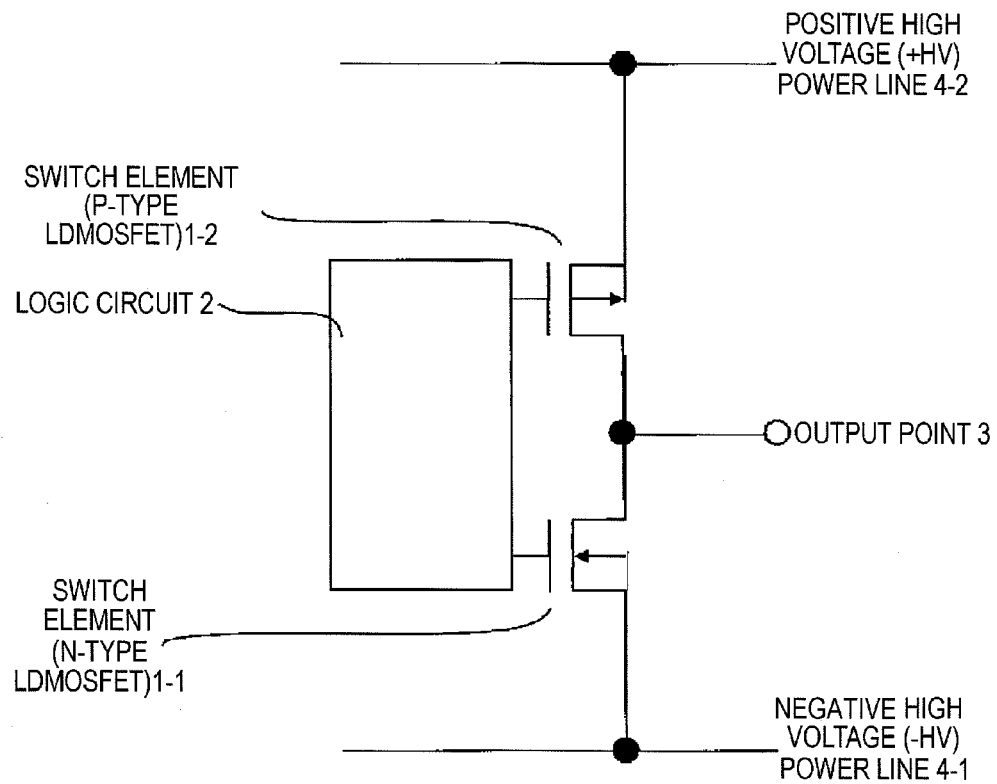
FIG. 1 is a circuit diagram of a high voltage output driver.
Figure 2:
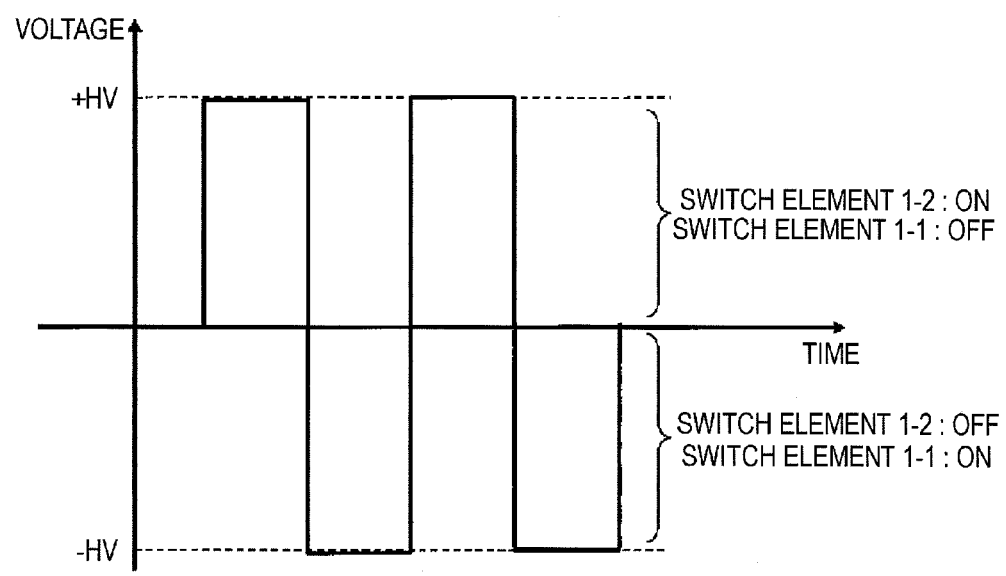
FIG. 2 is a schematic diagram of a voltage change at an output point in a normal operation of the high voltage output driver circuit.
Figure 3:
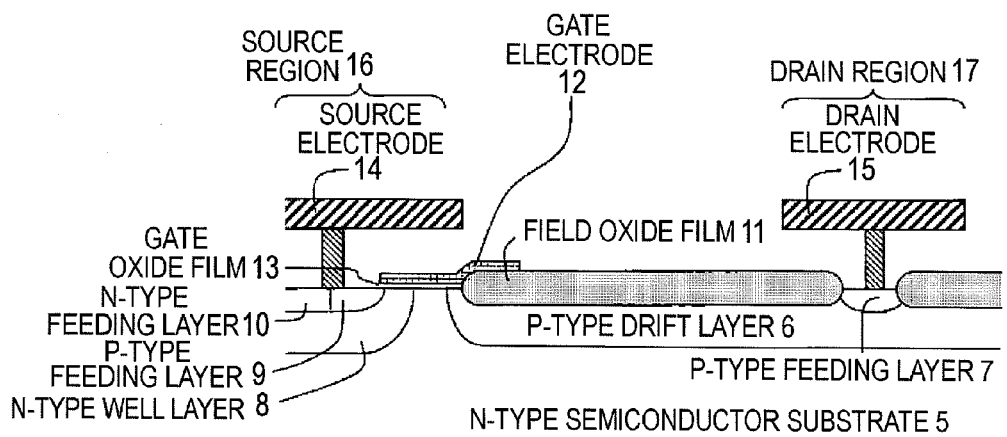
FIG. 3 is a cross-sectional view illustrating a related art p-type channel LDMOSFET structure.
Figure 4:
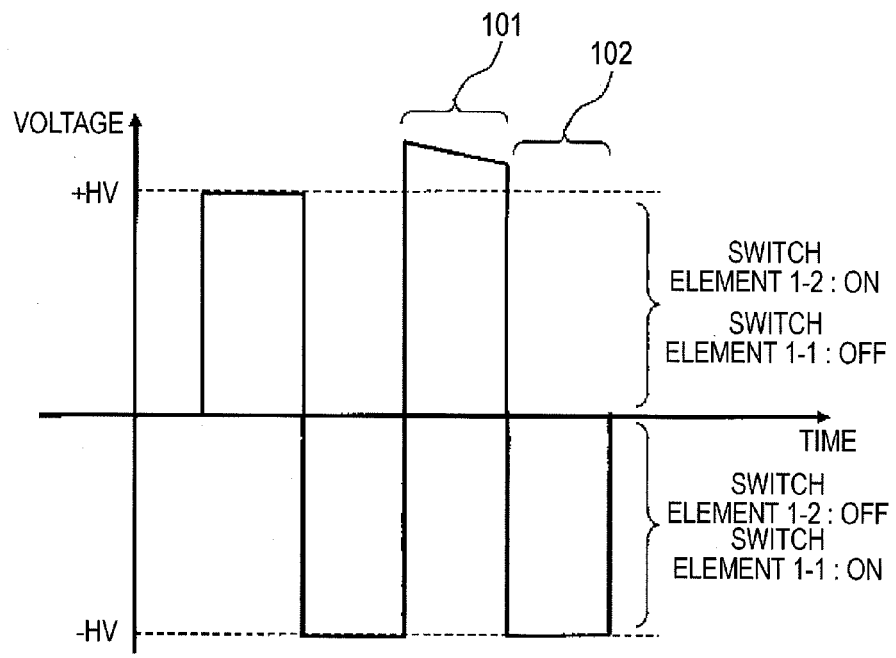
FIG. 4 is a schematic diagram of a voltage change at the output point in a specific operation of the high voltage output driver circuit.
Figure 5:
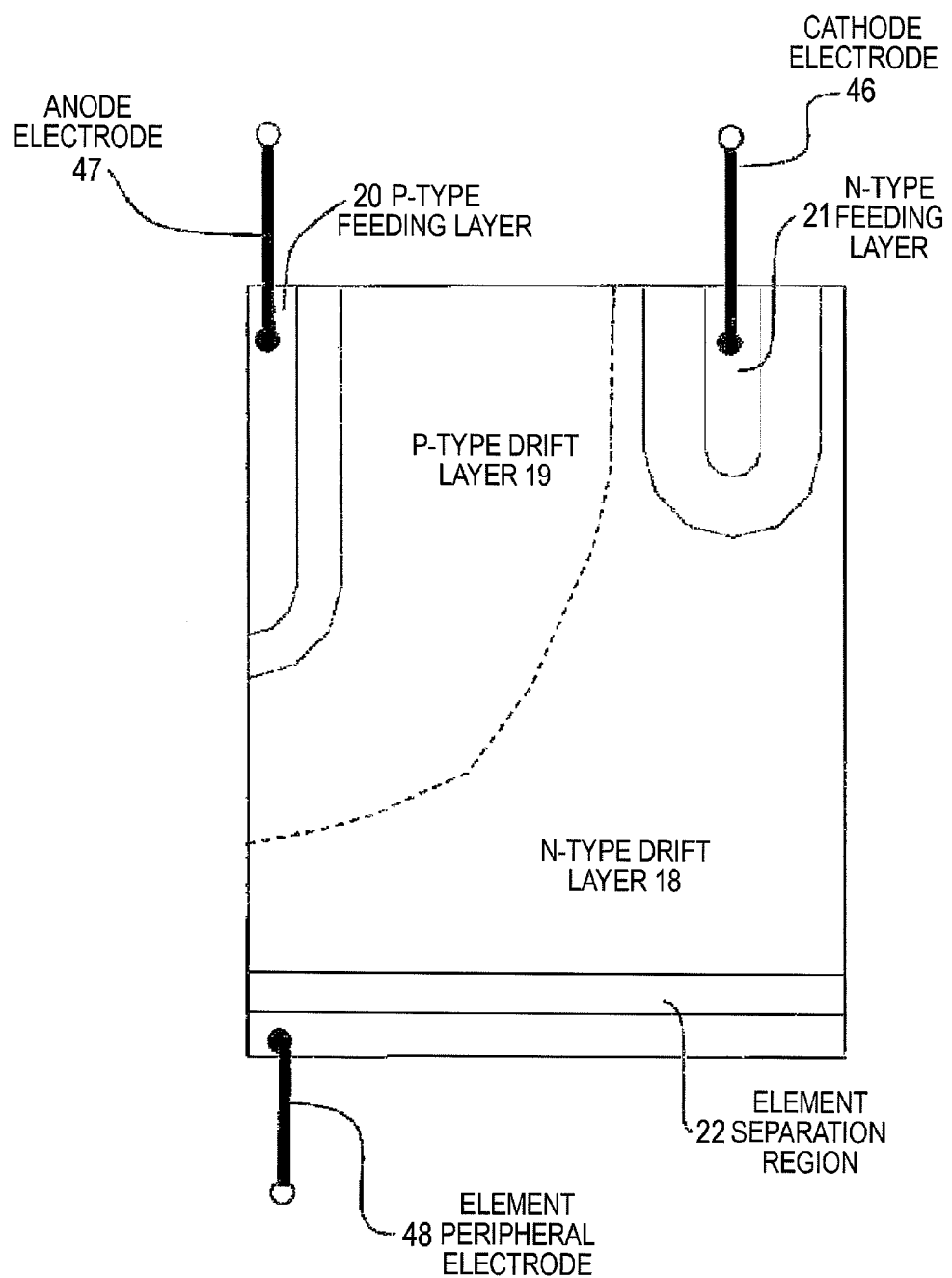
FIG. 5 is a plan view of the related art p-type channel LDMOSFET structure at a portion conducting parasitic diode operation.
Figure 6:
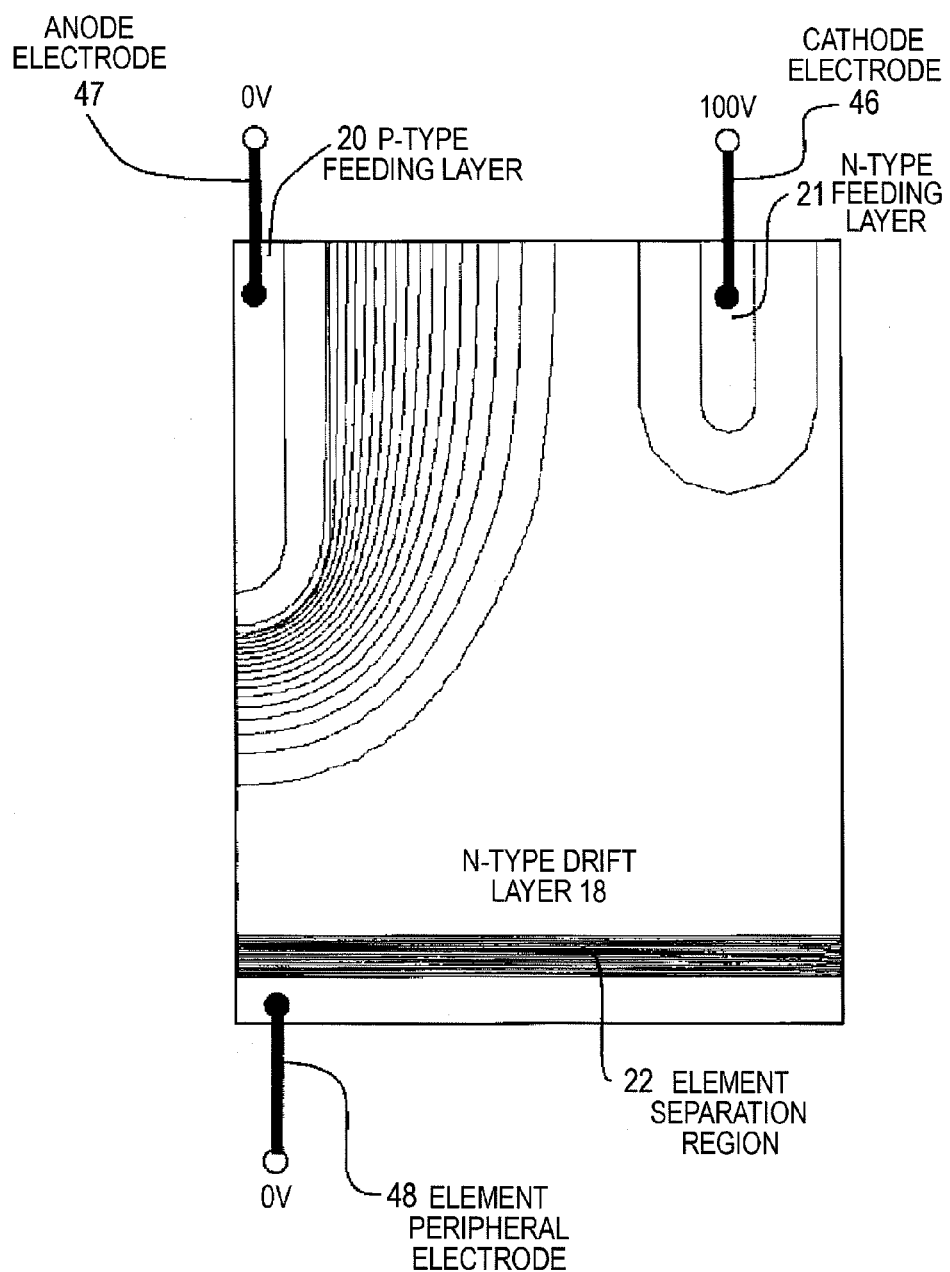
FIG. 6 is a diagram illustrating a potential distribution at the time of reverse recovery of a parasitic diode in the related-art p-type channel LDMOSFET.
Figure 7:
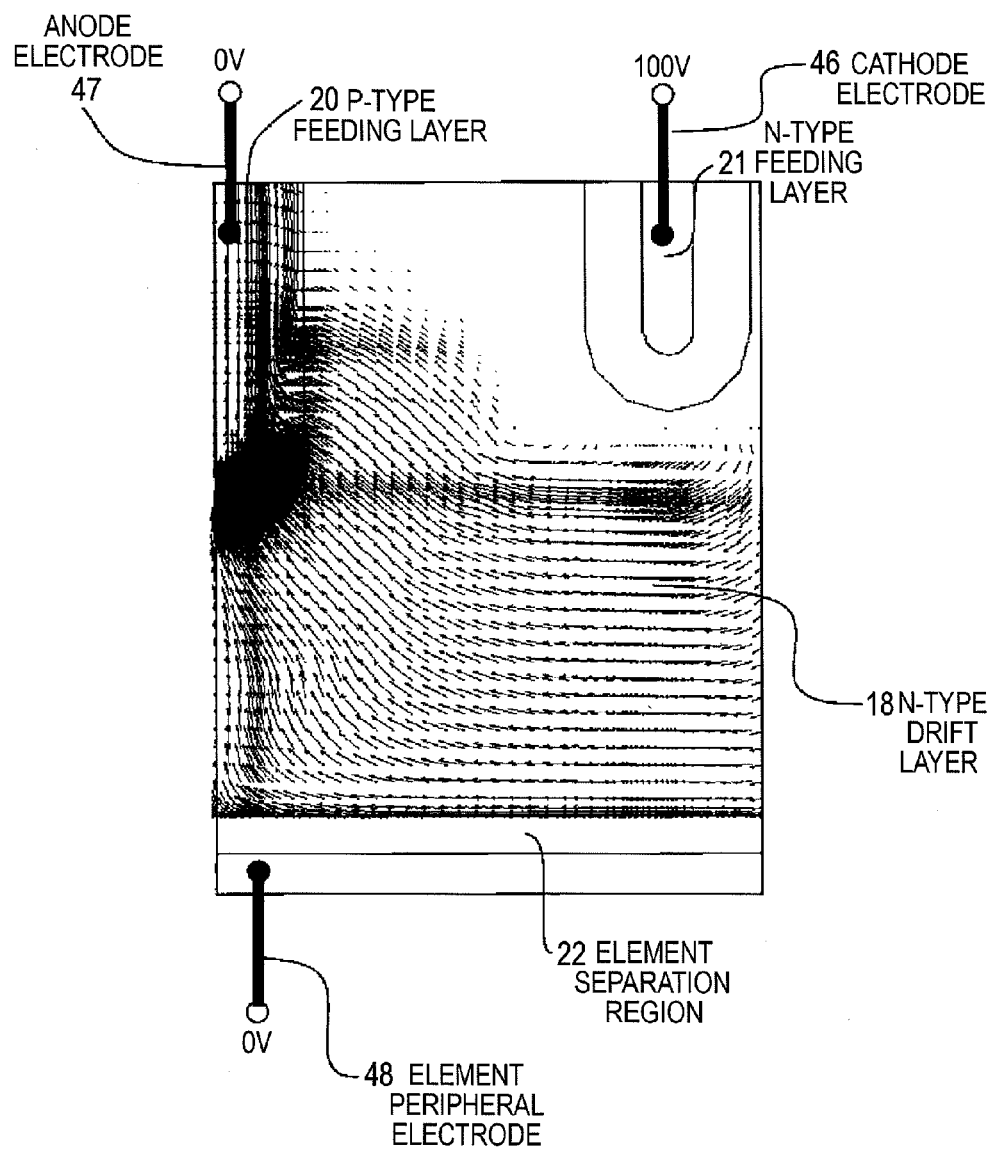
FIG. 7 is a diagram illustrating a hole distribution at the time of the reverse recovery of the parasitic diode in the related-art p-type channel LDMOSFET.
Figure 8:
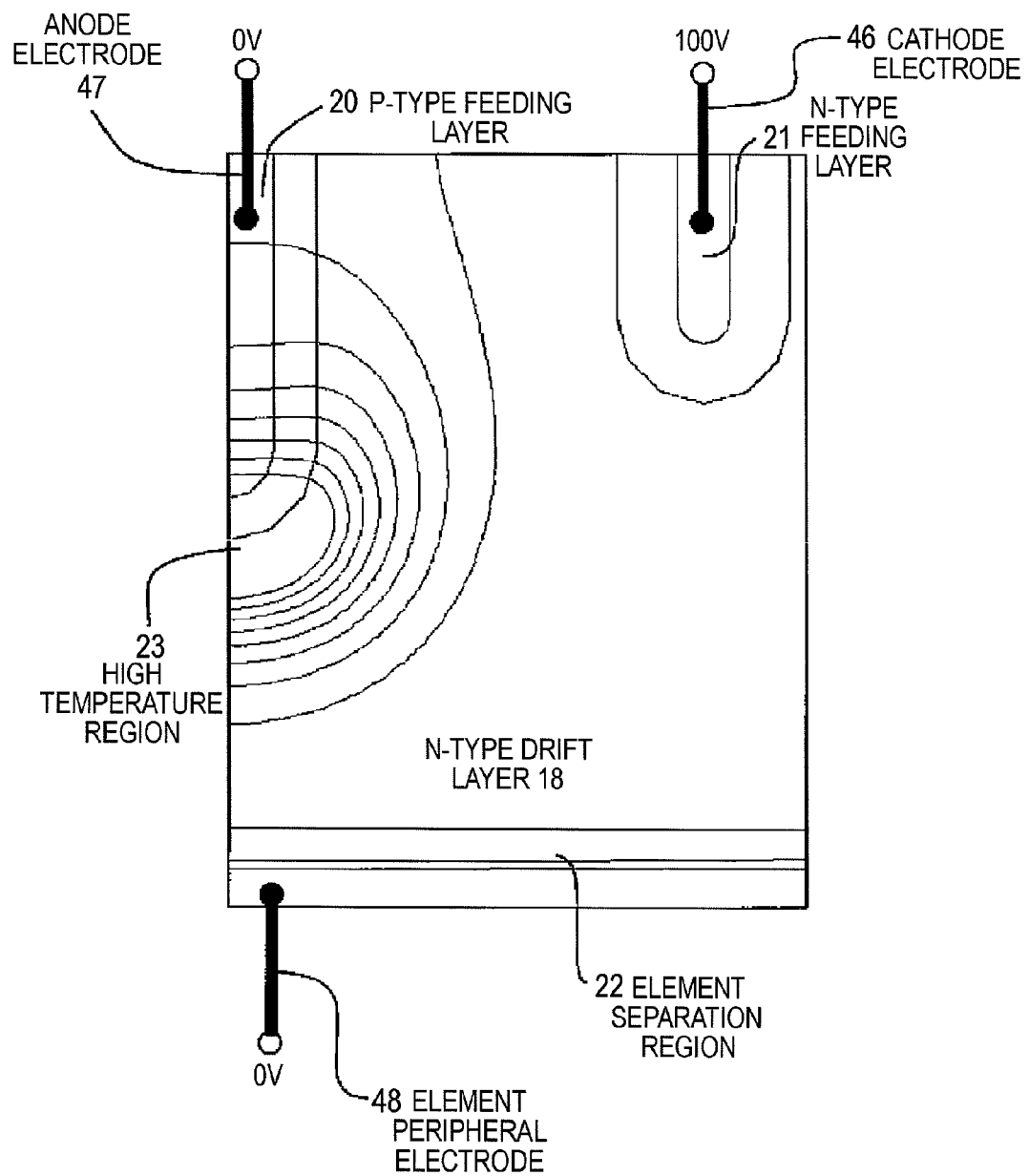
FIG. 8 is a diagram illustrating an element temperature distribution at the time of the reverse recovery of the parasitic diode in the related-art p-type channel LDMOSFET.
Figure 9:
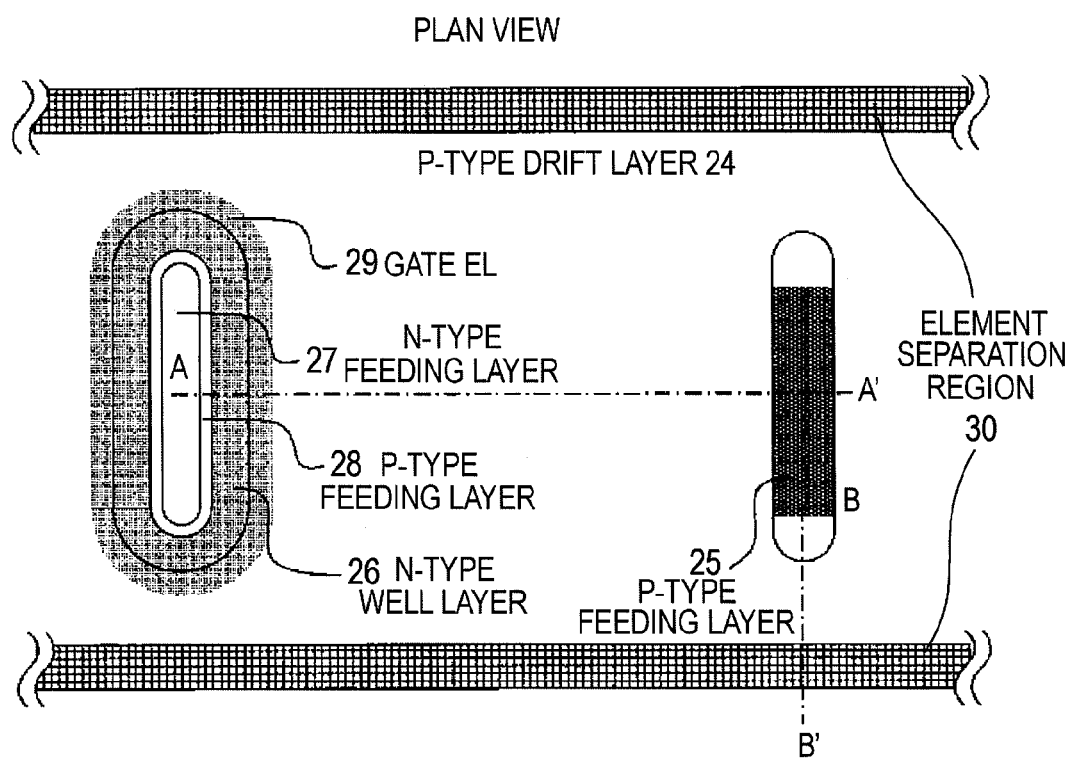
FIG. 9 is a plan view illustrating a structure of a p-type channel LDMOSFET according to a first embodiment of the present invention.
Figure 10A:
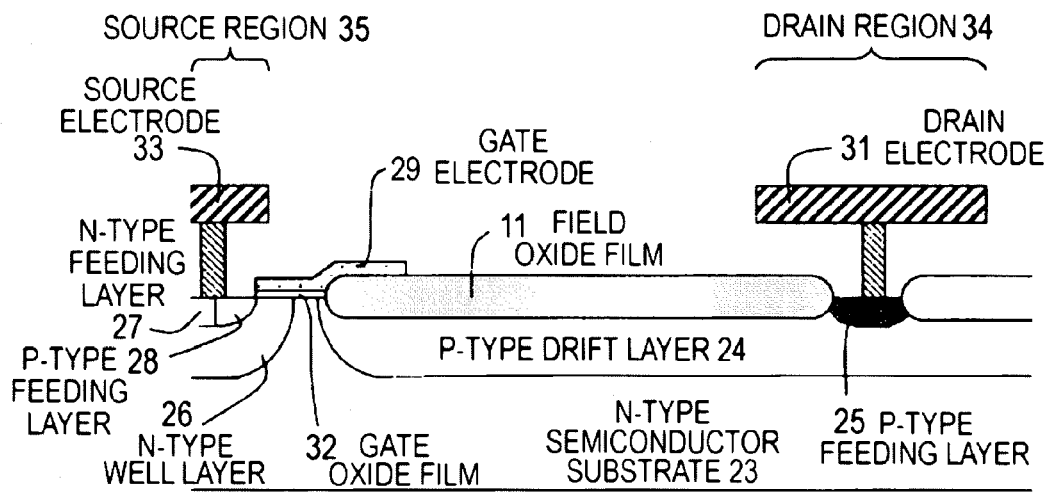
Figure 10B:
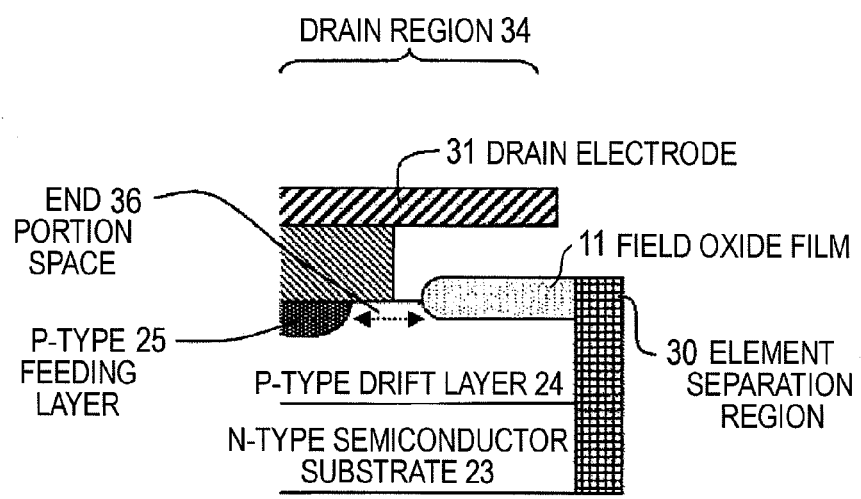

FIG. 9 is a plan view illustrating a structure of a high withstand voltage LDMOSFET according to a first embodiment of the present invention, and FIGS. 10A and 10B are cross-sectional views illustrating the structure of the high withstand voltage LDMOSFET according to the first embodiment of the present invention (a cross-sectional view of FIG. 9). A field oxide film 11 is selectively formed on a surface of an n-type substrate 23 to form a p-type drift layer 24 low in concentration through implantation and diffusion.

Subsequently, a gate oxide film 32 and a gate electrode 29 are patterned to form a gate region.

Further, an n-type well layer 26 is implanted and diffused in the gate region in a self-alignment manner to form a channel region. Further, an n-type feeding layer 27 of the n-type well layer 26, a source p-type feeding layer 28, and a drain p-type feeding layer 25 (p+ layer) are formed through implantation and diffusion.

In this example, the drain p-type feeding layer 25 is formed through implantation with a drain end portion masked to provide a region 36 (hereinafter also called "space") as a space in which there is no p-type feeding layer between the drain p-type feeding layer 25 and the field oxide film 11. Also, an element separation layer 30 is formed.

Finally, a source electrode 33 is formed over a source plug that is electrically connected to the n-type well feeding layer 27 and the source p-type feeding layer 28, and a drain electrode 31 is formed over a drain plug that is electrically connected to the drain p-type feeding layer 25, to thereby complete a p-type channel LDMOSFET according to the present invention.

Figure 12:
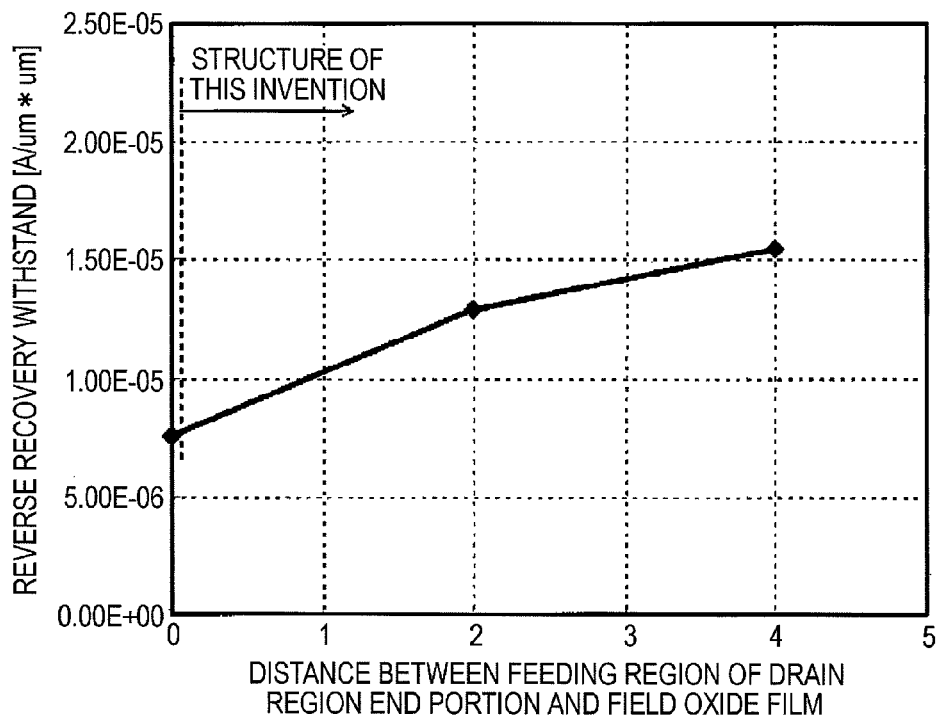
FIG. 12 is a diagram illustrating actual measurement results exhibiting the effects of the p-type channel LDMOSFET structure according to the first embodiment of the present invention.

FIG. 12 illustrates results confirmed by actual measurement of the reverse recovery withstand.

Figure 11:
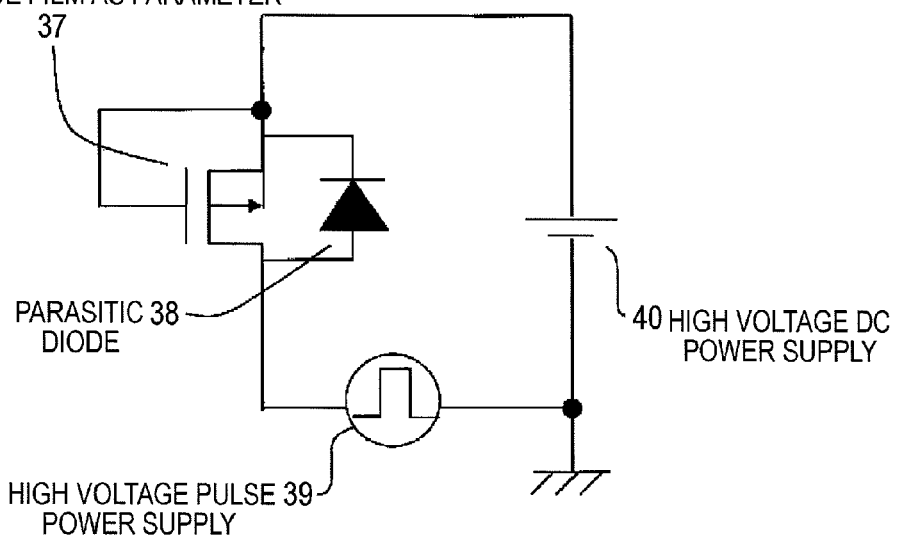
FIG. 11 is a circuit diagram of an evaluation circuit that actually measures the reverse recovery withstand of the parasitic diode of the LDMOSFET in the cross-sectional views of FIGS. 10A and 10B.

FIG. 11 illustrates a measuring method. In the LDMOSFET having a distance between a feeding region of a drain region end portion and a field oxide film as a parameter, a pulse voltage is applied to a drain terminal from a power supply 39. On the other hand, a voltage of 150V is applied to a source terminal short-circuiting a gate terminal by a DC power supply 40. In this measurement, a parasitic diode 38 of the LDMOSFET becomes in a forward state at the time of applying a pulse voltage, and a forward current flows in the parasitic diode 38. The parasitic diode 38 transitions to a reverse direction, that is, comes to a reverse recovery state, when the pulse voltage falls.

Then, in this measurement, a maximum forward current allowed to flow immediately before breakdown is regarded as a reverse recovery withstand. It is found that the reverse recovery withstand is increased as the distance between the feeding region of the drain region end portion and the field oxide film is increased.

The results exhibit the advantages that when the concentration of the feeding $p^+$ layer end portion of the drain region which operates as the anode of the parasitic diode is decreased, the amount of holes implanted from this site at the time of the forward state is decreased, and the amount of holes concentrated on this site at the time of the reverse recovery is decreased, to thereby avoid the concentration of the current.

Figure 13:
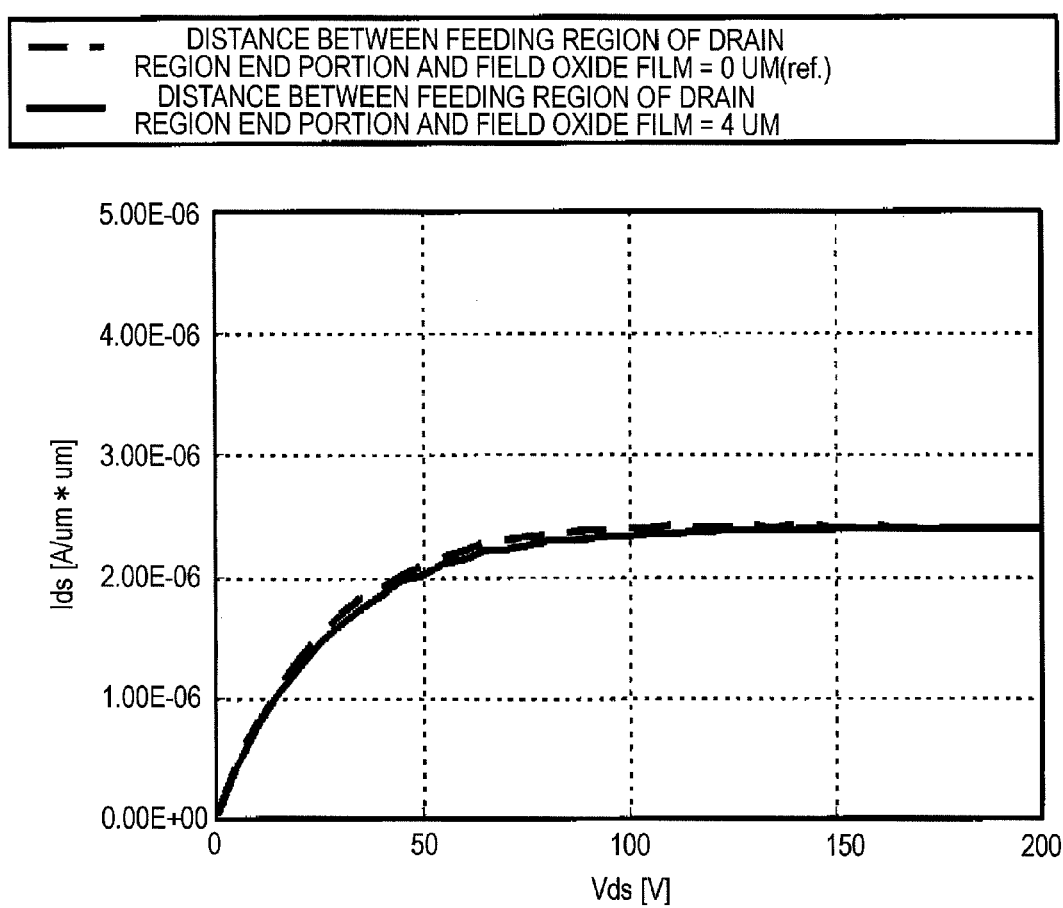
FIG. 13 is a diagram illustrating the actual measurement results exhibiting points where there is no adverse effect in the characteristics of the p-type channel LDMOSFET according to the first embodiment of the present invention.

FIG. 13 illustrates the actual measurement results of the current performance of the LDMOSFET according to the present invention. It is confirmed that even if the drain p-type feeding layer is formed at a distance from the drain end portion field oxide film, an FET current performance is not changed. This is because a ratio of a resistance of the feeding site of the drain end portion to the on-state resistance of the overall FET is very small. From the above viewpoint, according to the present embodiment, the reverse recovery withstand of the parasitic diode can be improved without adversely affecting the current performance of the high withstand voltage LDMOSFET.

Second Embodiment

Figure 14:
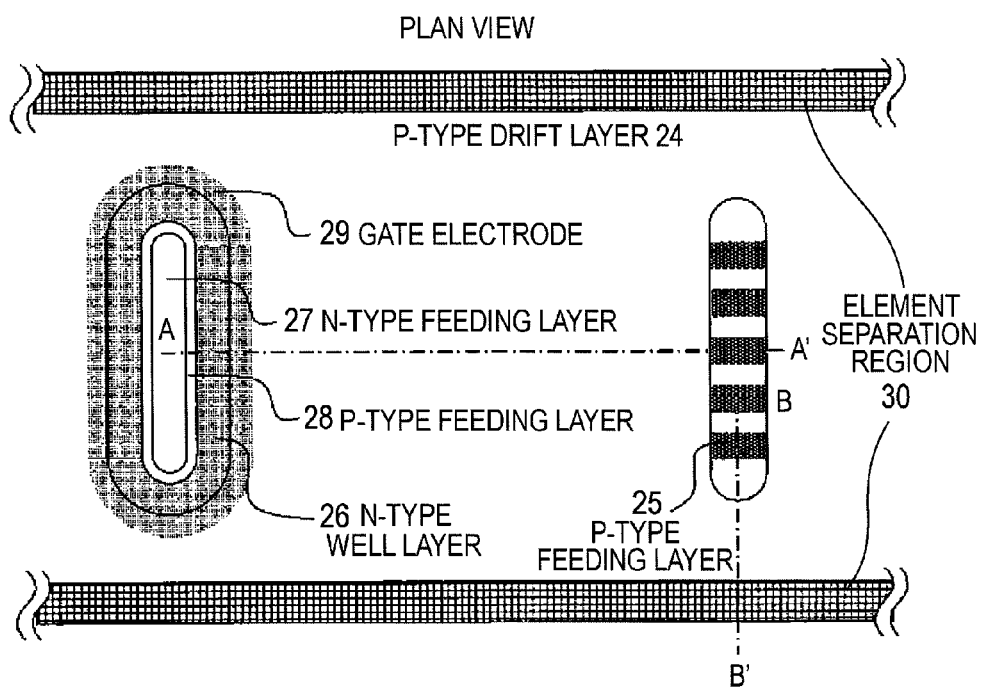
FIG. 14 is a plan view illustrating a structure of a p-type channel LDMOSFET according to a second embodiment of the present invention.
Figure 15A:
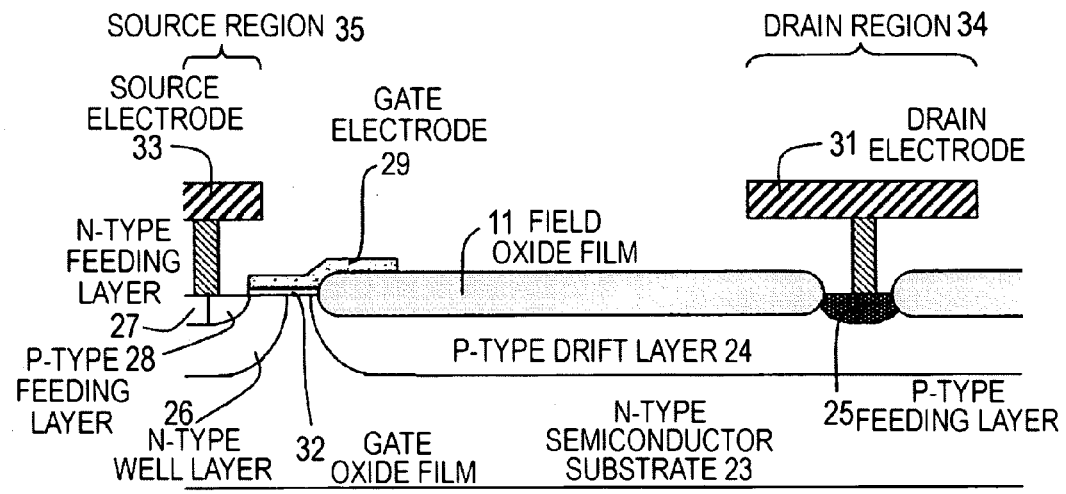
Figure 15B:
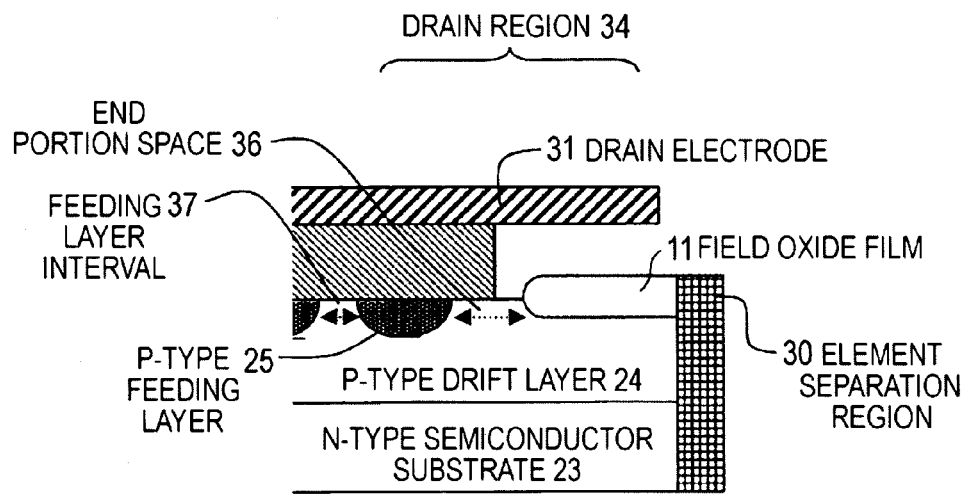

FIG. 14 is a plan view illustrating a structure of a high withstand voltage LDMOSFET according to a second embodiment of the present invention. FIGS. 15A and 15B are cross-sectional views (cross-sectional views of FIG. 14) illustrating the structure of the high withstand voltage LDMOSFET according to the second embodiment of the present invention.

A field oxide film 11 is selectively formed on a surface of an n-type substrate 23 to form a p-type drift layer 24 low in concentration through implantation and diffusion.

Subsequently, a gate oxide film 32 and a gate electrode 29 are patterned to form a gate region.

Then, an n-type well layer 26 is implanted and diffused in the gate region in a self-alignment manner to form a channel region.

Further, an n-type feeding layer 27 of the n-type well layer 26, a source p-type feeding layer 28, and a drain p-type feeding layer 25 are formed through implantation and diffusion.

In this example, the drain p-type feeding layer 25 is formed through implantation with a drain end portion masked to provide a space region 36 in which there is no p-type feeding layer between the drain p-type feeding layer 25 and the field oxide film 11.

Further, the center of the drain region is also masked at given intervals, and formed through the implantation so that sites in which the p-type feeding layer is present and sites in which the p-type feeding layer is not present are alternately disposed with an interval 37. Then, the element separation layer 30 is formed. Finally, a source electrode 33 is formed over a source plug that is electrically connected to the n-type well feeding layer 27 and the source p-type feeding layer 28, and a drain electrode 31 is formed over a drain plug that is electrically connected to the drain p-type feeding layer 25, to thereby complete a p-type channel LDMOSFET according to the present invention.

Figure 16:
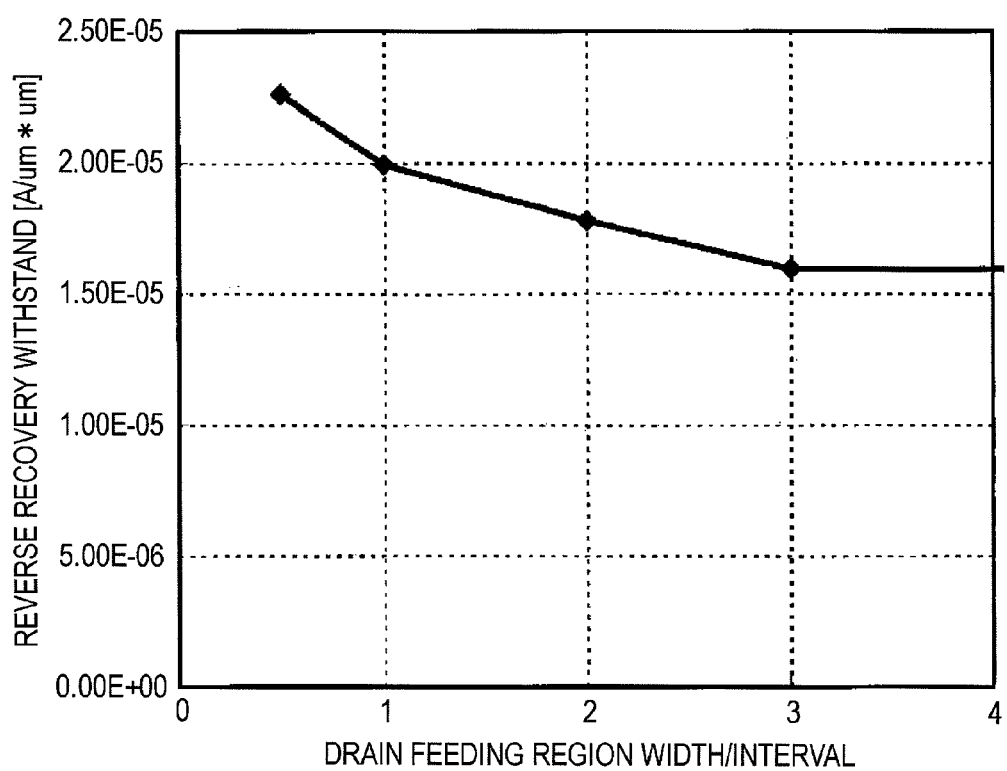
FIG. 16 is a diagram illustrating actual measurement results exhibiting the effects of the p-type channel LDMOSFET structure according to the second embodiment of the present invention.

FIG. 16 illustrates results confirmed by actual measurement of the reverse recovery withstand.

In this example, the measurement is implemented with a width/interval ratio of the drain feeding layer 25 as a parameter. It is found that in a drain feeding region center portion, the reverse recovery withstand is increased as ratio of the width to the interval is reduced (that is, the space is increased). The results exhibit the advantages that when the concentration of the feeding p$^+$ layer of the drain region which operates as the anode of the parasitic diode is decreased, the amount of holes implanted at the time of the forward state is decreased, and the amount of holes returned to the feeding layer at the time of the reverse recovery is decreased, to thereby reduce the concentration of the current. Also, the results exhibit the advantages that the number of end portions of the anode where the current is liable to be concentrated is increased by intermittently forming the feeding layer so that the concentrated amount of current per one end portion is decreased to improve the breakdown withstand.

Figure 17:
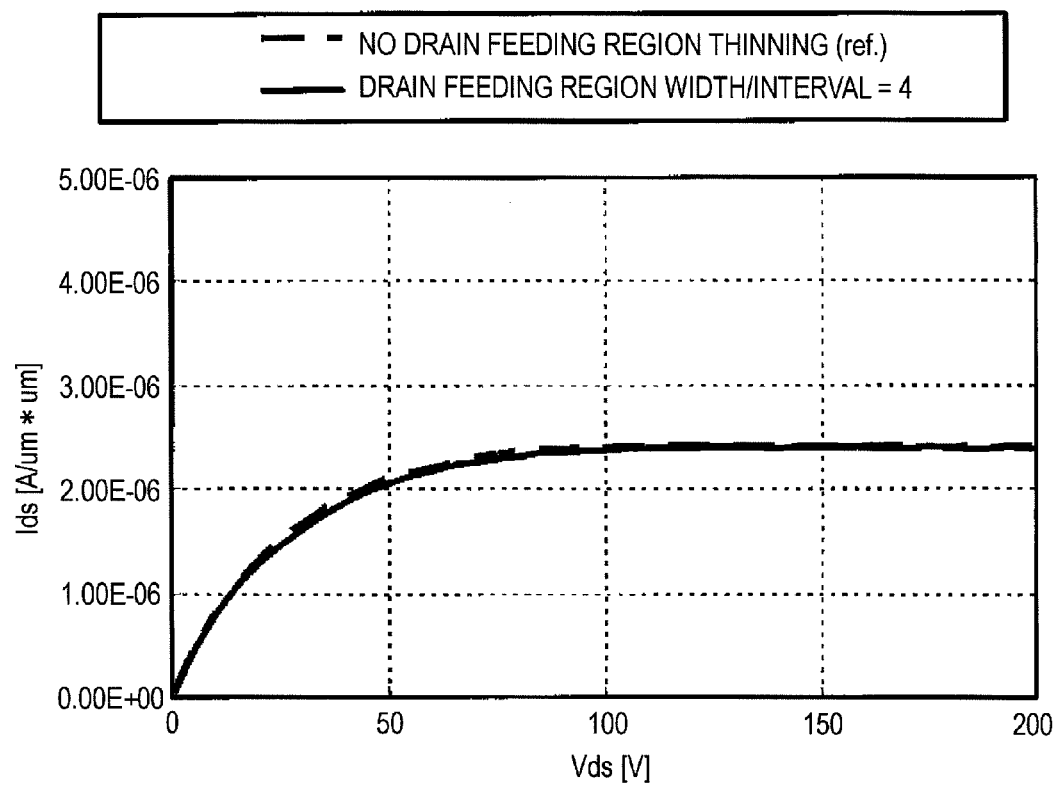
FIG. 17 is a diagram illustrating the actual measurement results exhibiting points where there is no adverse effect in the characteristics of the p-type channel LDMOSFET according to the second embodiment of the present invention.

FIG. 17 illustrates the actual measurement results of the current performance of the LDMOSFET according to the present embodiment. It can be confirmed that even if the drain p-type feeding layer is intermittently formed, the FET current performance is not changed. This is because a ratio of a resistance of the feeding site of the drain to the on-state resistance of the overall FET is very small. From the above viewpoint, it is found that the current performance of the high withstand voltage LDMOSFET is not substantially adversely affected. According to this embodiment, the reverse recovery withstand of the parasitic diode is improved.

Third Embodiment

Figure 18:
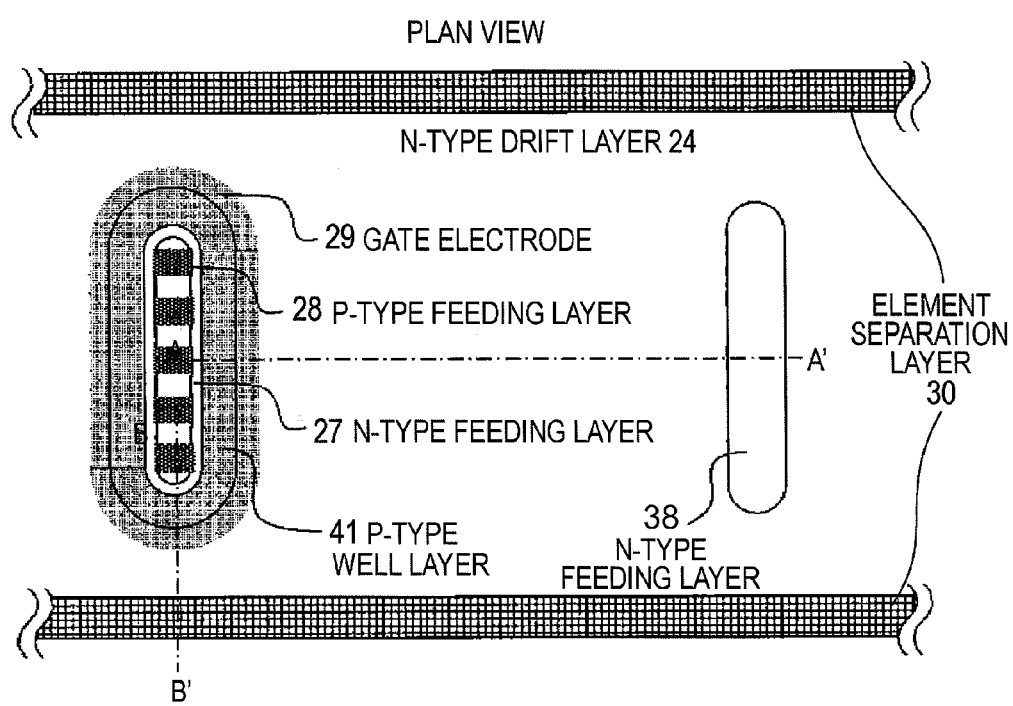
FIG. 18 is a plan view illustrating a structure of an n-type channel LDMOSFET according to a third embodiment of the present invention.
Figure 19A:
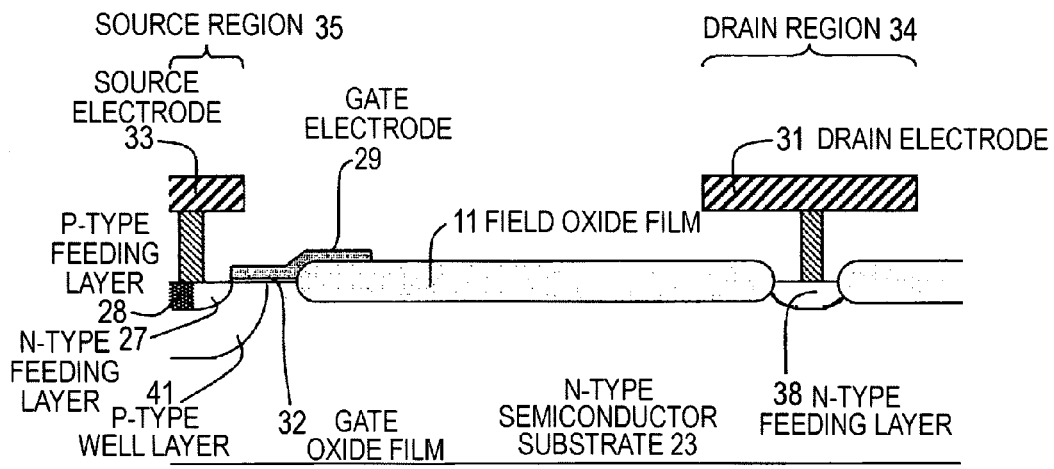
Figure 19B:
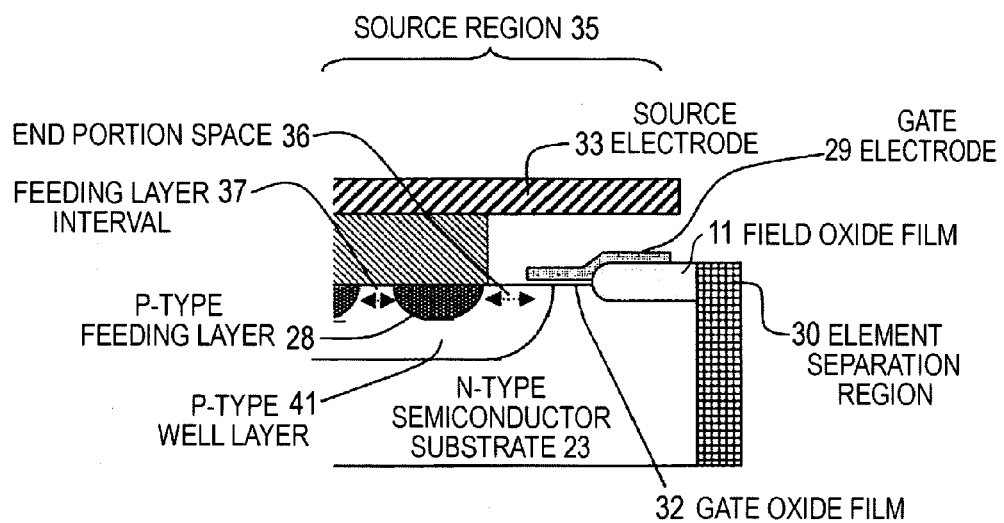

FIG. 18 is a plan view illustrating a structure of a high withstand voltage LDMOSFET according to a third embodiment of the present invention. FIGS. 19A and 19B are cross-sectional views (cross-sectional views of FIG. 18) illustrating the structure of the high withstand voltage LDMOSFET according to the third embodiment of the present invention.

A field oxide film 11 is selectively formed on a surface of an n-type substrate 23.

Subsequently, a gate oxide film 32 and a gate electrode 29 are patterned to form a gate region.

Then, a p-type well layer 41 is implanted and diffused in the gate region in a self-alignment manner to form a channel region. Further, a p-type feeding layer 28 of the p-type well layer 41, a source n-type feeding layer 27, and a drain n-type feeding layer 38 are formed through implantation and diffusion. In this example, the p-type feeding layer 28 of the source region is formed through implantation with a source end portion masked to provide a space 36 in which there is no p-type feeding layer between the source n-type feeding layer 27 and the gate electrode 29.

Further, the center of the drain region is also masked at given intervals, and formed through the implantation so that sites in which the p-type feeding layer is present and sites in which the p-type feeding layer is not present are alternately formed.

Then, the element separation layer 30 is formed. Finally, a source electrode 33 is formed over a source plug that is electrically connected to the p-type well feeding layer 28 and the source n-type feeding layer 27, and a drain electrode 31 is formed over a drain plug that is electrically connected to the drain n-type feeding layer 38, to thereby complete an n-type channel LDMOSFET according to the present invention.

Fourth Embodiment

Figure 20:
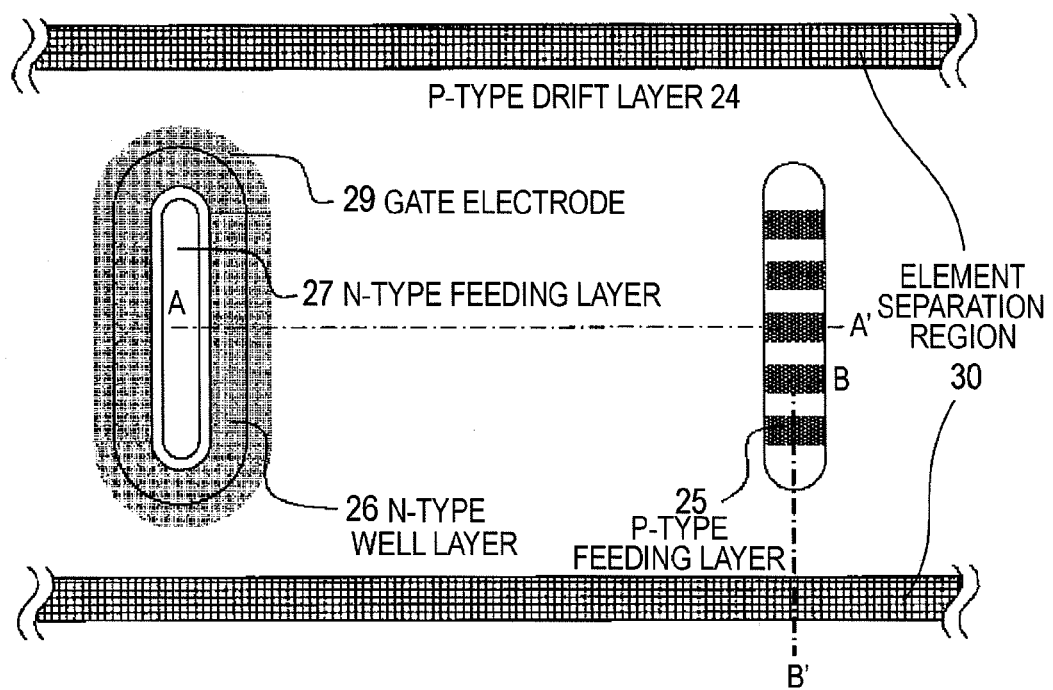
FIG. 20 is a plan view illustrating a structure of a diode according to a fourth embodiment of the present invention.
Figure 21A:
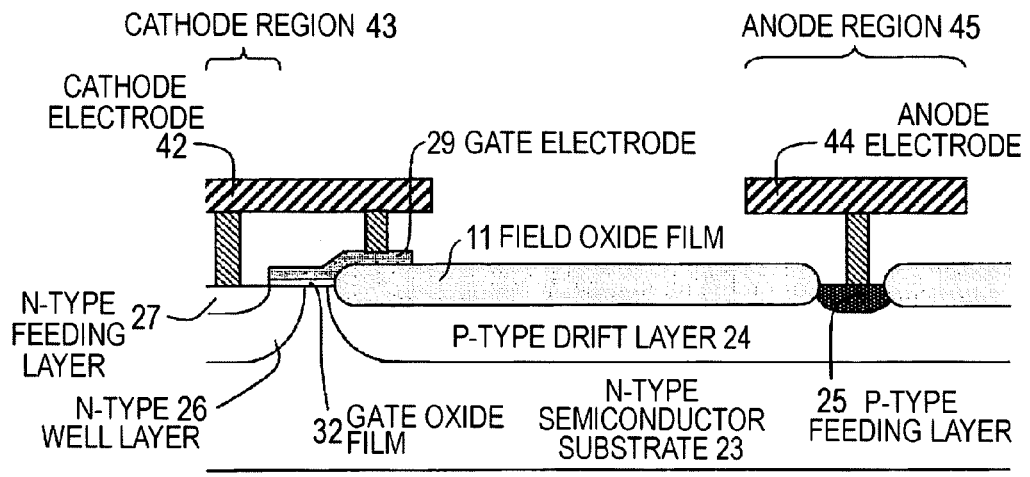
Figure 21B:
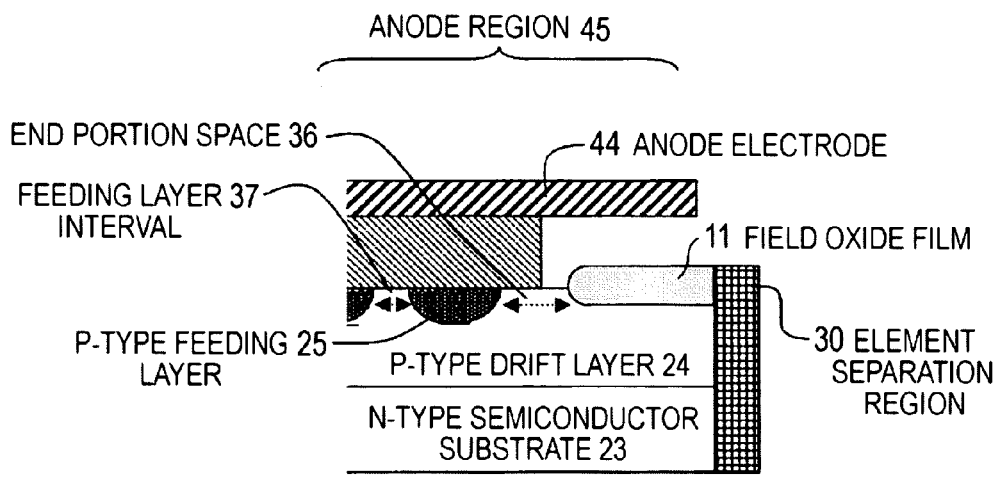

FIG. 20 is a plan view illustrating a structure of a high withstand voltage diode according to a fourth embodiment of the present invention. FIGS. 21A and 21B are cross-sectional views (cross-sectional views of FIG. 20) illustrating the structure of the high withstand voltage diode according to the fourth embodiment of the present invention. A field oxide film 11 is selectively formed on a surface of an n-type substrate 23, and a p-type drift layer 24 low in concentration is formed through implantation and diffusion.

Subsequently, a gate oxide film 32 and a gate electrode 29 are patterned and formed. Then, an n-type well layer 26 is implanted and diffused in the gate electrode 29 in a self-alignment manner. Further, an n-type feeding layer 27 of the n-type well layer 26, and an anode p-type feeding layer 25 are formed through implantation and diffusion. In this example, the anode p-type feeding layer 25 is formed through implantation with an anode end portion masked to provide a space 36 in which there is no p-type feeding layer between the anode p-type feeding layer 25 and the field oxide film 11. Further, the center of the anode region is also masked at given intervals, and formed through the implantation so that sites in which the p-type feeding layer is present and sites in which the p-type feeding layer is not present are alternately formed.

Then, the element separation layer 30 is formed. Finally, a cathode electrode 42 is formed over a cathode plug that is electrically connected to the n-type well feeding layer 27, an anode electrode 44 is formed over an anode plug that is electrically connected to the anode p-type feeding layer 25, and the gate electrode 29 is electrically connected to the cathode electrode 42 to thereby form a high withstand voltage diode according to the present invention.

Fifth Embodiment

Figure 22:
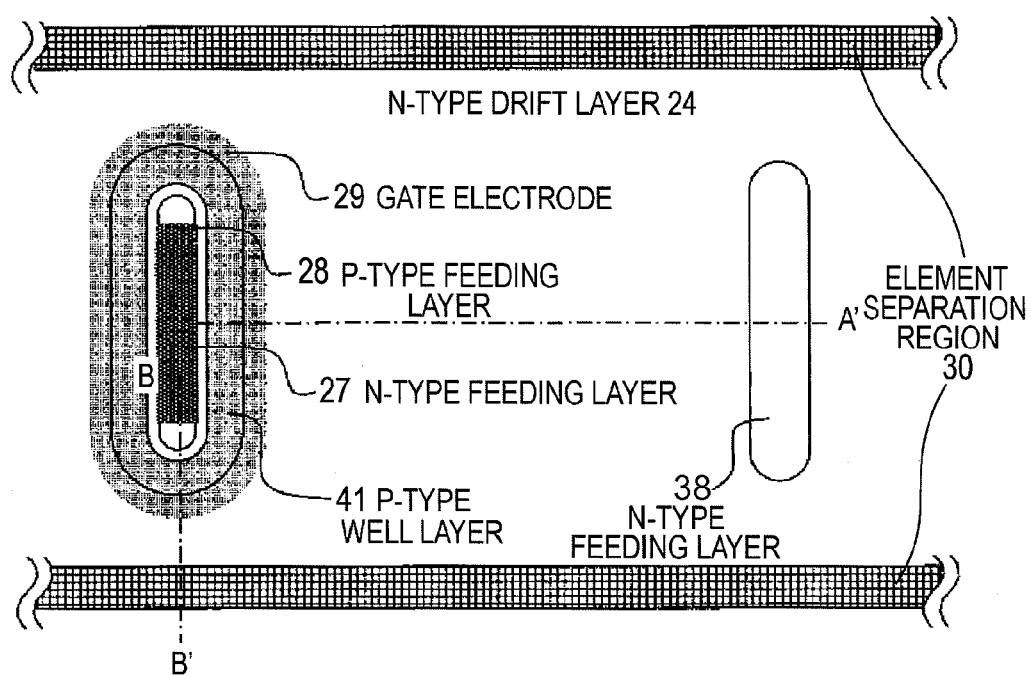
FIG. 22 is a plan view illustrating a structure of an n-type channel LDMOSFET according to a fifth embodiment of the present invention.
Figure 23A:
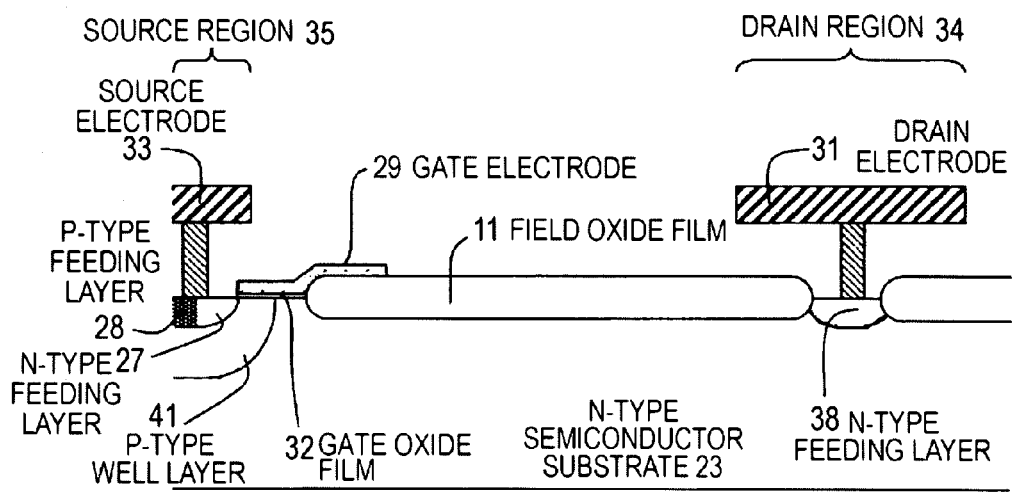
Figure 23B:
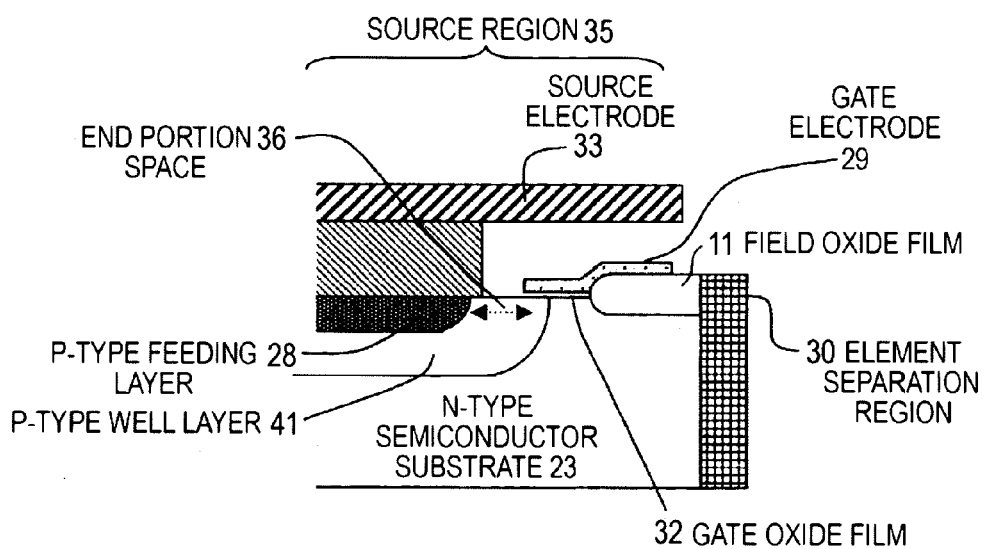

FIG. 22 is a plan view illustrating a structure of a high withstand voltage LDMOSFET according to a fifth embodiment of the present invention. FIGS. 23A and 23B are cross-sectional views (cross-sectional views of FIG. 22) illustrating the structure of the high withstand voltage LDMOSFET according to the fifth embodiment of the present invention.

A field oxide film 11 is selectively formed on a surface of an n-type substrate 23.

Subsequently, a gate oxide film 32 and a gate electrode 29 are patterned to form a gate region.

Then, a p-type well layer 41 is implanted and diffused in the gate region in a self-alignment manner to forma channel region. Further, a p-type feeding layer 28 of the p-type well layer 41, a source n-type feeding layer 27, and a drain n-type feeding layer 38 are formed through implantation and diffusion. In this example, the p-type feeding layer 28 of the source region is formed through implantation with a source end portion masked to provide a space 36 in which there is no p-type feeding layer between the source n-type feeding layer 27 and the gate electrode 29.

Then, an element separation layer 30 is formed. Finally, a source electrode 33 is formed over a source plug that is electrically connected to the p-type well feeding layer 28 and the source n-type feeding layer 27, and a drain electrode 31 is formed over a drain plug that is electrically connected to the drain n-type feeding layer 38, to thereby complete an n-type channel LDMOSFET according to the present invention.

What is claimed is:
1. A semiconductor device, comprising:
a semiconductor substrate;
a field oxide film that is selectively disposed on a surface portion of the semiconductor substrate;
a p-type drain region that is disposed in the vicinity of the field oxide film, and has a p-type feeding region;

an n-type source region that is disposed in the vicinity of the field oxide film, and has an n-type feeding region; and a gate electrode that faces a well region through a gate oxide film, wherein the p-type feeding region has a p-type feeding layer in which a $p^+$ layer is selectively formed on a p-type drift region on the semiconductor substrate, and wherein a drain electrode is disposed with a portion thereof electrically connected to a member in contact with both a portion in which the $p^+$ layer is disposed in the p-type feeding region, and a portion in which the $p^+$ region is not disposed but the p-type drift region is present in the p-type feeding region.

2. The semiconductor device according to claim 1, wherein the p-type drift region is disposed in contact with the field oxide film, and disposed on the semiconductor substrate side with respect to the field oxide film.

3. The semiconductor device according to claim 1, wherein the $p^+$ layer is formed by selectively introducing impurities onto the p-type drift region.

4. The semiconductor device according to claim 1, wherein the p-type feeding region is formed as an elongate region, a portion in which the p+ layer is not disposed but the p-type drift region is present is provided at both ends of the p-type feeding region and a portion in which the p+ layer is disposed is provided in a region of a middle portion of the p-type feeding region.

5. The semiconductor device according to claim 1, wherein the p-type feeding region is formed as an elongate region, wherein there are a plurality of first portions of the p-type feeding region in which the p+ layer is disposed, wherein there are a plurality of second portions of the p-type feeding region in which the p+ layer is not provided, but the p-type drift region is present, and wherein the first and second portions are alternately provided along a longitudinal direction of the p-type feeding region.

6. The semiconductor device according to claim 1, further comprising: an anode electrode, a gate electrode, and a cathode electrode, wherein the gate electrode and the cathode electrode are electrically connected to each other to provide a diode configuration.

7. The semiconductor device according to claim 1, wherein the semiconductor substrate is an SOI substrate.

8. The semiconductor device according to claim 4, wherein the drain electrode is in contact with the portions at both ends of the p-type feeding region.

9. The semiconductor device according to claim 5, wherein the drain electrode is in contact with the first and second portions.

* * * * *